United States Patent
Ohtsu et al.

(10) Patent No.: US 6,680,242 B2
(45) Date of Patent: Jan. 20, 2004

(54) METHOD OF FORMING CRYSTALLINE SEMICONDUCTOR THIN FILM ON BASE SUBSTRATE, LAMINATION FORMED WITH CRYSTALLINE SEMICONDUCTOR THIN FILM AND COLOR FILTER

(75) Inventors: Shigemi Ohtsu, Nakai-machi (JP); Keishi Shimizu, Nakai-machi (JP); Kazutoshi Yatsuda, Nakai-machi (JP); Eiichi Akutsu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 168 days.

(21) Appl. No.: 09/977,947

(22) Filed: Oct. 17, 2001

(65) Prior Publication Data

US 2002/0132454 A1 Sep. 19, 2002

(30) Foreign Application Priority Data

Mar. 19, 2001 (JP) .................. 2001-079155
Jun. 28, 2001 (JP) .................. 2001-196561

(51) Int. Cl.⁷ .................. H01L 21/20; H01L 21/336; H01L 21/26
(52) U.S. Cl. .................. 438/487; 438/486; 438/308; 438/795
(58) Field of Search .................. 438/166, 308, 438/486, 487, 535, 795; 428/412, 457, 458

(56) References Cited

U.S. PATENT DOCUMENTS 5,939,194 A * 8/1999 Hashimoto et al. ...... 428/411.1
6,358,784 B1 * 3/2002 Zhang et al. ........... 438/166
6,420,032 B1 * 7/2002 Iacovangelo ........... 428/412
2003/0003304 A1 * 1/2003 Ohtsu et al. ........... 428/412

FOREIGN PATENT DOCUMENTS

| JP | A 5-92192 | 4/1993 |
| JP | A 5-315361 | 11/1993 |
| JP | A 5-326402 | 12/1993 |
| JP | A 6-11738 | 1/1994 |
| JP | A 6-315614 | 11/1994 |
| JP | A 7-102678 | 4/1995 |
| JP | A 9-129012 | 5/1997 |
| JP | A 11-133224 | 5/1999 |
| JP | A 11-174790 | 7/1999 |
| JP | A 11-335894 | 12/1999 |
| JP | A 2000-68520 | 3/2000 |

* cited by examiner

Primary Examiner—Carl Whitehead, Jr.
Assistant Examiner—David L. Hogans
(74) Attorney, Agent, or Firm—Oliff & Berridge, PLC

(57) ABSTRACT

A method of forming a crystalline semiconductor thin film on a base material which can be prepared at a low temperature by simple step and device, the method including a processing step of applying UV-rays to an amorphous semiconductor thin film provided on a base material while keeping a temperature at not less than 25° C. and not more than 300° C. in a vacuum or a reducing gas atmosphere, as well as a substrate having the semiconductor thin film provided on the base material, a substrate for forming a color filter and a color filter using the substrate.

13 Claims, 4 Drawing Sheets

METHOD OF FORMING CRYSTALLINE SEMICONDUCTOR THIN FILM ON BASE SUBSTRATE, LAMINATION FORMED WITH CRYSTALLINE SEMICONDUCTOR THIN FILM AND COLOR FILTER

BACKGROUND OF THE INVENTION

1. Field of the Invention

This invention concerns a method of forming a crystalline semiconductor thin film on a substrate, a lamination formed with a crystalline semiconductor thin film on a substrate, a lamination for use in a substrate provided with a transparent conductive thin film and a transparent semiconductor thin film used for production of various kinds of display devices such as CCD cameras or liquid crystal display devices or camera image sensors, particularly, for the color filter suitable to portable terminals such as portable telephones or small personal computers, as well as color filters manufactured by using the substrate.

2. Description of the Related Art

Photoconductors having catalytic activity or photovoltaic activity have been noted for their specific applications in recent years. For example, titanium dioxide as a photosemiconductor is said to oxidatively decompose organic contaminants deposited on the surface, air contaminating substances such as nitrogen oxides (NOx), sulfur oxides (SOx) and malodor substances, as well as bacteria by the oxidizing action based on the photocatalytic activity. As actual application examples, various uses have been proposed such as a method of appending a titanium dioxide photocatalyst on outer walls of buildings to elate air contaminating substances under sunlight. (Japanese Published Unexamined Patent Application No. Hei 6-315614). A method of appending a titanium dioxide catalyst on walls or hand rails in hospitals thereby killing bacteria (Japanese Published Unexamined Patent Application No. Hei 7-102678), a method of dispersing a powder of titanium dioxide catalyst in waste water and applying the light of a UV-ray lamp to decompose dirt in water (Japanese Published Unexamined Patent Application No. Hei 5-92192) or a method of utilizing a self-cleaning effect of a photocatalyst in order to mitigate cleaning maintenance for fluorescent lamps or illumination instruments (Japanese Published Unexamined Patent Application Hei 9-129012).

Further, it has been known that the surface of the photoconductive thin film is rendered a highly hydrophilic based on the photoreaction, and various application uses have been considered for preventing clouding of mirrors (in bath rooms or automobiles), lenses and glass windows.

It has also been known that a self-cleaning effect is obtained when the photosemiconductor thin film is formed on surfaces of building outer walls, automobile glass and window glass, hydrophobic dirt is less deposited and, in addition, dirt, if deposited, is decomposed based on the hydrophilic property on the surface of the film and the dirt or the decomposition products thereof are easily flushed away by rain fall or water washing due to the hydrophilic property of the photoconductor thin films.

For the preparation of photosemiconductor thin films, there have been known a method of hydrolyzing a titanium compound such as titanium alkoxide or titanium acetate, coating and drying the product on the surface of a base material and then sintering at a temperature of 500° C. or higher thereby obtaining an anatase type titanium dioxide film, a method of forming an amorphous titanium dioxide layer by a vapor deposition process and annealing the resultant amorphous titanium dioxide layer at 400° C. or higher to form a layer containing anatase type titanium dioxide, a method of crystallizing the surface of metal titanium by oxidizing at a temperature of 500° C. or higher or a method of obtaining an anatase type titanium dioxide film by an RF sputtering method in a state of heating a base material to 250° C. or higher.

In the methods described above, the method of forming a photosemiconductor thin film by sintering the amorphous titanium dioxide film requires heating of the substrate at a high temperature for a long time, which increases the cost in view of economy. Further, formation of the photoconductor thin film by this method on a plastic base material to be described later is actually impossible in view of the heat resistance of the plastic substrate. Further, while the RF sputtering method is excellent as a method of obtaining an anatase titanium dioxide of high photovoltaic activity, it is necessary to use an expensive apparatus and it is difficult to manufacture the photoconductor thin film at a reduced cost by this method. Although some of plastic base materials have heat resistance of 250° C., those having heat resistance of 250° C. and also having transparency and available at a reasonable cost have not yet been known at present.

By the way, the photoconductor thin film has been noted for the photovoltaic function in addition to characteristics such as antifouling, antibacterial and anti clouding effect based on the photochemical reaction on the surface as described above. The photovoltaic effect is a phenomenon that when a substrate provided with a conductive thin film and a photoconductor thin film is dipped in water or a solution having an electrolyzing function and UV-rays are applied to the photoconductor thin film, photovoltaic activity is generated at the irradiated area. By utilizing the phenomenon, a film can be formed selectively for example to the irradiated area. That is, when the substrate is dipped in an electrodeposition solution containing a film forming electrodeposition substance and UV-rays are applied to the photoconductive thin film in a state of applying or not applying a bias voltage between the conductive thin film and a counter electrode located in the solution, photovoltaic activity is generated at the light-irradiated area of the photosemiconductor thin film and the film forming substance is electrodeposited to the area. In the case where the photovoltaic activity of the semiconductor thin film is sufficiently large, the bias voltage can be reduced to 0.

The present inventors have previously filed a method of forming an extremely fine pattern at a good resolution which is useful for a color filter or the like by utilizing the photovoltaic activity (Japanese Published Unexamined Patent Application Nos. Hei 1-174790, Hei 11-133224, and Hei 11-335894).

In recent years, liquid crystal display panels provided with color filter include (1) those having a driving substrate on which driving elements such as thin film transistors (hereinafter sometimes referred to as "TFT") and pixel electrodes are arranged in a matrix and a filter substrate having a color filter and a counter electrode which are opposed under positional alignment by way of a spacer in which a liquid crystal material is sealed in a gap portion and (2) those having a color filter-integrated type driving substrate with the color filter being formed directly to the driving substrate and a counter substrate having an electrode opposed to each other simply by way of a spacer in which liquid material is sealed in the gap portion. Each of the color filters described above can be manufactured by the photo-electrodeposition method using the photosemiconductor thin film as described in the patent publications.

The former liquid crystal display panel involves the problem in that an exposure mask is required upon manufacture of the color filter and error tends to occur in the accuracy of the positional alignment between both of the driving and filter substrates to lower the display quality or production yield. On the other hand, the latter has been noted at present since a bias voltage can be applied selectively by TFT disposed on the driving substrate (addressing), so that the exposure mask is not necessary and positional alignment is not required between both of the substrates the manufactured of the color filter. However, the latter method leads to increase cost since it is necessary to make the color filter conductive by using through holes or the like.

Further, in recent years, demand for smaller size equipment as portable terminals such as telephones or small personal computers has tended to increase rapidly and various studies have been made with a viewpoint of portable performance. Particularly, in the case of equipment with an aim of portable use, portability in outdoor and impact shock resistance to external force are considered important and it is demanded that they are light in weight and cause less breakage upon dropping or the like.

With the viewpoint, use of flexible plastic substrates has been noted instead of existent glass substrates as a substrate for constituting a liquid display panel. Generally, for the flexible substrates for the liquid crystal use, plastic materials having transparency and high heat resistance and excellent in gas barrier property have been demanded, but the heat resistance is only about at 223° C. even in polyether sulfone (PES) which is considered to have the highest heat resistance, so that it is difficult to dispose the photosemiconductor thin film described above on the plastic substrate and formation of the color filter by the photo-electrodeposition method on the plastic substrate has not yet been attained commercially.

Further, for the liquid crystal panel using the plastic substrate, only the STN system not requiring TFT driving circuit has been known. This is because a high temperature processing step is necessary for forming a polycrystal semiconductor thin film at high carrier concentration used in TFT and manufacture of the TFT driving circuit on the plastic substrate is impossible at present. Then, as the method of manufacturing the color filter for use in the liquid crystal panel by adopting the plastic substrate, only (1) the ink jet method and (2) the electrodeposition method have been put to practical use. While the inkjet method has an advantage of not including a photolithographic step, it tends to cause color mixing and poor in view of the resolution and the positional accuracy. Further, since the electrodeposition method requires formation of an electrode corresponding to a pixel, the pattern shape is restricted to a stripe pattern or the like and cannot be used for the liquid crystal panel provided with a TFT driving circuit.

Further, manufacture of the TFT driving circuit to the plastic substrate is impossible at present as described above but there is a strong demand for the liquid crystal display panel using the plastic substrate provided with the TFT circuit. Particularly in recent years, there is a strong demand for the display capable of displaying video information and communication information at high resolution, and color filters of higher fineness has been demanded. For this purpose, it has been desired for the establishment in a method of manufacturing a flexible substrate provided with a TFT driving circuit capable of high fineness display and a method of forming a color filter to the substrate.

For this purpose, it has been demanded to manufacture not only the photosemiconductor thin film described above but also the semiconductor thin film such as used for the TFT circuit at a low temperature efficiently.

As a method of forming a semiconductor thin film on a plastic base material, Japanese Published Unexamined Patent Application No. Hei 6-11738 describes a method of manufacturing a semiconductive crystalline silicon film of an MIM device by irradiating the thin film surface of an insulative silicone-based compound material with an energy beam such as a laser beam thereby melting a surface layer and converting the surface layer to a crystalline silicon film while leaving the insulative silicon-based compound material to an under layer. Further, Unexamined Patent Application No. Hei 5-315361 discloses a method of manufacturing a crystallized semiconductor film without giving thermal damage by laser beam to the plastic film, as a method of forming a semiconductor thin film on a plastic film, by forming an amorphous material film and an oxide insulative film in this order on a plastic film, applying a laser beam on the side of the oxide insulative film and melting to crystallize the amorphous material film near the boundary between the amorphous material film and the oxide insulative film. Further, Japanese Unexamined Patent Application No. Hei 5-326402 also describes a method of forming a polycrystal silicon by layer by forming a thermo-barrier layer to a plastic film, forming an amorphous silicon layer thereof and then applying a laser beam in order to eliminate the effect of heat by the laser beam.

Each of the methods described above is a method of annealing the amorphous semiconductor film with a laser beam thereby crystallizing the same but this is a method of melting to crystallize only the surface of the amorphous semiconductor layer, or disposing a thermo-barrier layer such that the effect heat by the laser beam (which may possibly rise to 1000° C.). Accordingly, the methods described above cannot crystallize the entire amorphous layer. Further, they require another step of providing the thermobarrier layer and also requires an expensive laser beam irradiation device. In addition, since it is necessary to scan the laser beam spot over the entire film, they also involve a disadvantage that it is difficult to increase the area of the film and take a long time for crystallizing the entire area.

Further, Japanese Published Unexamined Patent Application No. 2000-68520 describes a method of applying a VU-ray laser beam at a short wavelength (excimer laser beam) for converting an amorphous silicon thin film into a crystalline silicon semiconductor thin film. While this method gives less thermal effect to the base material, the base material is still heated to a temperature near 600° C., so that only glass is used as the base material.

SUMMARY OF THE INVENTION

This invention has been accomplished in view of the problems described above and provides a method of manufacturing a semiconductor thin film which can be manufactured at a low temperature by using simple and convenient step and device, as well as to provide a substrate having a semiconductor thin film provided on a base material, a color filter forming substrate and a color filter using the substrate described above.

This can be attained by the provision of a method of manufacturing a semiconductor thin film, a substrate and a color filter described below.

According to an aspect of the present invention, a method of forming a crystalline semiconductor thin film on a base material has a step of: applying UV-rays to an amorphous semiconductor thin film provided on a base material while keeping a temperature at not less than 25° C. and not more than 300° C. in a vacuum or a reducing gas atmosphere.

The reducing gas atmosphere may contain a hydrogen gas.

The UV-rays may be light from an excimer lamp.

The kept temperature may be within a temperature range from 50° C. to 250° C.

The base material may be a plastic base material and the kept temperature may be within a temperature range from 50° C. to the heat resistant temperature of the plastic base material. The heat resistant temperature of the plastic base material may be from 100 to 230° C.

The amorphous semiconductor thin film may be an oxide semiconductor thin film.

The amorphous semiconductor thin film may be a titanium dioxide thin film formed by a sputtering method.

The crystalline semiconductor thin film may be an anatase type titanium oxide thin film or a thin film including mixed crystals of anatase type titanium dioxide and rutile type titanium dioxide.

A transparent conductive thin film may be disposed between the base material and the amorphous semiconductor thin film.

Another aspect of the present invention provides a lamination having at least a base material and a crystalline semiconductor thin film manufactured by the method described above.

Another aspect of the present invention also provides a lamination having at least a base material, a transparent conductive thin film and the crystalline semiconductor thin film manufactured by the described above.

The base material may be a plastic base material.

The lamination may be used as a substrate for forming a color filter.

Another aspect of the present invention also provides a lamination at least having a plastic base material and a crystalline semiconductor thin film.

The crystalline semiconductor thin film may be an anatase type titanium oxide thin film or a thin film comprising mixed crystals of anatase type titanium dioxide and rutile type titanium dioxide.

Another aspect of the present invention also provides a lamination having at least a plastic base material, a transparent conductive thin film and a crystalline semiconductor thin film in this order.

The lamination may be used as a substrate for forming a color filter.

Another aspect of the present invention provides a color filter having the lamination described above and a colored film formed on the lamination by a photo-electrodeposition method or a photocatalytic method.

Another aspect of the present invention also provides a method of applying UV-rays to an amorphous metal oxide thin film disposed on a base material under a reduced pressure or in a reducing gas atmosphere, thereby changing the amorphous metal oxide into a crystalline metal oxide thin film.

UV-rays may be irradiated uniformly on the thin film.

The method may further include a step of keeping a temperature higher than a normal temperature during irradiation of the UV-rays.

BRIEF DESCRIPTION OF THE DRAWINGS

Preferred embodiments of this invention will be described in detail based on the followings, wherein.

PREFERRED EMBODIMENTS OF THE INVENTION

Figure 1:
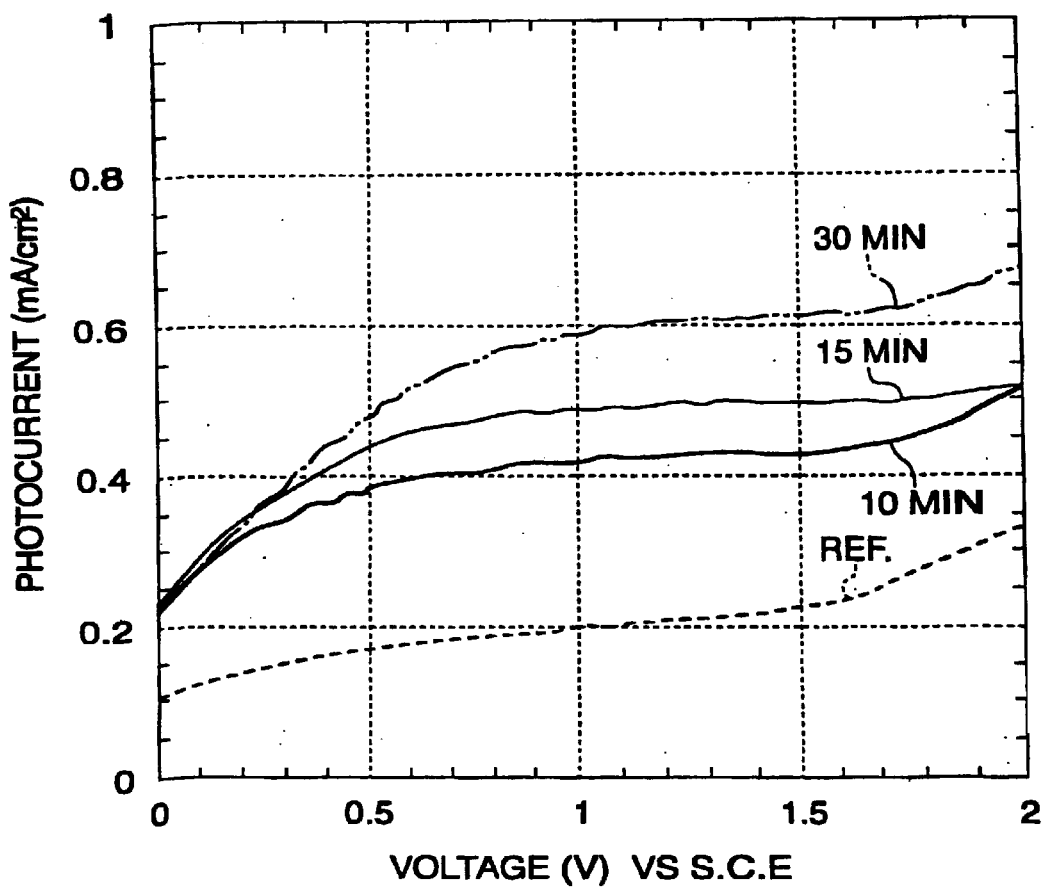
FIG. 1 is a graph showing current/voltage characteristics before and after annealing for an amorphous titanium dioxide thin film.

The method of forming the crystalline semiconductor thin film according to this invention has a feature of applying UV-rays to an amorphous semiconductor thin film while hating the same at a relatively low temperature. Compared with an existent method of annealing an amorous semiconductor thin film by irradiation of a laser beam at a temperature near 1000° C. thereby obtaining a crystalline semiconductor thin film, the heating temperature can be lowered extremely in this invention, and there is no requirement of scanning laser beam spot but UV-rays may be merely applied on the entire surface by an UV-ray irradiation device. Therefore, compared with the existent method, a semiconductor thin film can be manufactured in a short period of time and requiring no large-scaled device, and as a result, the production cost can be lowered outstandingly.

Accordingly, while special steps or devices were required in the prior art to form a semiconductor thin film on a plastic substrate, a crystalline semiconductor thin film can now be manufactured on a plastic substrate by simple and convenient method and device according to this invention.

Further, for applying an anticlouding, antifouling or hydrophilic treatment to the surface of a mirror or glass, it was necessary to form an amorphous semiconductor thin film on the surface of a mirror or glass and sintering the same at a temperature of 400° C. or higher and it was a complicated process. However, according to the manufacturing method of this invention, since a substrate providing a photosemiconductor thin film on a plastic base material can be obtained easily, a desired surface property can be obtained extremely simply by merely appending such a substrate that to the surface requires anticlouding, antifouling or hydrophilic treatment.

Further, it has become possible to manufacture a TFT driving circuit on a plastic base material or provide a semiconductor thin film for generating photovoltaic activity further thereon to form an electrodeposited substrate thus obtaining a color filter film by photo-electrodeposition. Particularly, in the case of the color filter, transparency is required for the base material but transparent plastic base materials known at present have the heat resistance only at about 200° C. Therefore, it is highly evaluated that a semiconductor thin film of a sufficiently high photoelectronic conversion efficiency (photovoltaic activity) can be formed by the heat treatment at about 200° C. Accordingly, it can be expected for the application as a flexible color filter for use in liquid crystal display panels, for which weight reduction will be demanded more and more.

As the base material used for the manufacturing method according to this invention, glass base material, plastic base material such as plastic film, sheet or plate, ceramic base material such as ceramic sheet or ceramic plate, or single crystal substrate such as of Si, GaN, GaAs, or GaP can be used with particular restriction. The plastic base material can include, for example, plastic films, sheets or plates made of polyethylene terephthalate, polyethylene naphthalate, polyether ether ketone, polyether sulfone, polysulfone, polyether imide, polyether ketone, polyphenylene sulfide, polyallylate, polyimide, polycarbonate and norbornene resin (trade name of product: ARTON manufactured by JSR Corporation). They are preferably flexible. Among the resins described above, the norbornene resin has been noted in recent years as a resin having a high transparency over a wide wavelength range and also having excellent heat resistance ("Chemical Business Journal", monthly magazine, 1997, December, Extra Issue).

In the case where a substrate having a crystalline semiconductor thin film manufactured by the method according to this invention is used for anticlouding or antifouling treatment of articles that reflect or transmit light, it is necessary that the base material is also transparent.

Further, in the case of manufacturing a crystalline semiconductor thin film using a substrate formed by providing a conductive thin film and an amorphous semiconductor thin film to a base material and manufacturing a color filter by a photo-electrodeposition method using the substrate formed with the crystalline semiconductor thin film, it is necessary that both of the base material and the conductive thin film are transparent. Further, for preparing a crystalline semiconductor thin film of high photoelectronic conversion efficiency used in the photo-electrodeposition method, it is desirable that the heating temperature is relatively higher, so that a plastic base material of higher heat resistance is necessary in the case of using a plastic base material as the base material. Polyimide (heat resistant temperature: 331° C.) is representative as a heat resistant plastic but, when transparency is required for the base material, polycarbonate (PC) (heat resistant temperature: 205° C.), polyether sulfone (PES)(heat resistant temperature: 223° C.), polysulfone (PS) (heat resistant temperature: 190° C.), ARTON (heat resistant temperature: 171° C.) are used suitably. Particularly, since heat resistant PC or PES has high transparency, can provide heat resistance up to about 200° C. and has less optical anisotropy, it is suitable as the base material for forming the semiconductor thin film for use in liquid crystal components.

Further, in this invention, the heat resistant temperature of the plastic base material means a glass transition point that is about 100 to 230° C.

Further, according to the method of this invention, most of semiconductor thin films belonging to n type semi conductors can be manufactured. Specifically, they can include Si, SiC, GaN, diamond, ZnSe, C—BN, StTiO$_2$, TiO$_2$ and ZnO. Among them, metal oxide semiconductors such as TiO$_2$ and ZnO have a large band gap, are transparent and also excellent in photoirradiation efficiency (photovoltaic efficiency). Particularly, TiO$_2$ is excellent in the stability when dipped in an electrodeposition solution, has absorption only at 400 nm or less and has transparency, it can be used as it is for the photosemiconductor thin film used for manufacturing color filters. Further, it is also preferred to apply the same to the application such as anticlouding or antifouling treatment described above.

"Amorphous" in the amorphous semiconductor thin film in this invention means not only the completely amorphous thin film but also those in which an amorphous portion and a crystal portion are mixed together in the category of "amorphous" described above. Even for the semiconductor thin film containing amorphous portion only slightly, it has been confirmed that the crystallinity is increased to enhance the photocatalytic effect or photoelectronic conversion effect to increase the crystallinity applying the treatment according to this invention. Further, "crystallinity" for the crystalline semiconductor thin film according to this invention can include both polycrystal and single crystal.

In this invention, for the method of forming the amorphous semiconductor thin film, a sputtering method, an RF method, an EB vapor deposition method, or ion plating method can be used.

In the case of preparing a semiconductor thin film on a plastic base material, film deposition is possible even at a relatively low temperature, for example, at a temperature lower than the heat resistant temperature (230° C. or lower) for various highly transparent plastics known at present. Further, a sputtering method or an RF sputtering method with less damage to the base material is used preferably.

The heating temperature for the amorphous semiconductor thin film in this invention, although depending also on the heating time, is 25° C. or higher, preferably, 50° C. or higher at which the amorphous state can effectively be converted into a crystalline state and higher heating temperature is preferred for increasing the degree of crystallinity. Accordingly, while there is no particular restriction on the upper limit of the heating temperature, it is preferably at about 300° C., more preferably, at about 250° C. in view of the selection for the heating method, control for the heating temperature and the energy loss. In order to improve the efficiency of the degree of crystallinity efficiently and make the heating condition reasonable, it is preferred to heat the amorphous semiconductor thin film to about 100 to 200° C.

Further, in the case where the base material is a plastic base material, the upper limit for the heating temperature is a heat resistant temperature of the plastic base material. The heat resistant temperature of the plastic base material is about 230° C. at the highest in the case of the plastic base materials mentioned above. Further, it is preferred also in the case of the plastic base material to heat the same at about 100 to 200° C. with the viewpoint described above (when the heat resistant temperature of the plastic base material is 200° C. or less, the upper limit is within a range up to the heat resistant temperature).

UV-rays can be applied sufficiently by commercially available UV-ray irradiation devices and, among all, an excimer lamp is used preferably. Further, UV-rays at a shorter wavelength has larger light energy and UV-rays at 365 nm or less, preferably, 308 nm or less are used preferably (for example UV-rays for example at 308 nm, 200 nm, 172 nm)

The amorphous semiconductor thin film can be converted sufficiently into a crystalline semiconductor thin film by the irradiation dose of UV-rays at about 1 to 50 mW/cm$^2$. Further, the amorphous semiconductor thin film can be converted into the crystalline semiconductor thin film more effectively generally by longer irradiation time of UV-rays. Although depending on the heating temperature or the kind of the semiconductor thin film to be manufactured, about 10 to 30 min is appropriate, for example, in the case of heating and maintaining amorphous titanium dioxide at 150° C.

The atmospheric in heating and UV-irradiation is preferably a vacuum or a reducing gas atmosphere and, particularly preferably, an atmosphere at a low oxygen partial pressure. The heating temperature for amorphous semiconductor thin film can be lowered more by lowering the oxygen partial pressure. "Vacuum" means a vacuum degree generally of about $10^{-2}$ Pa or less and it can be determined properly by taking other conditions into consideration. The kind of the gas is appropriately selected depending on the kind of the semiconductor thin film to be manufactured and, for example, one or more of hydrogen gas, nitrogen gas, ammonia gas, rare gas such as He, Ne or Ar or carbon monoxide are used and a reducing atmosphere containing the hydrogen gas is preferred.

For example, in the case where the semiconductor is an oxide semiconductor such as titanium dioxide, when an annealing treatment is conducted in a highly pure nitrogen gas reducing atmosphere containing 2 to 5% of hydrogen (less than detonation limit) (flow rate being 0.5 to 2 l/min in the case of using a device having 1 liter capacity), the state of crystal transforms from amorphous to polycrystal, and oxygen lattice defects are caused to increase the carrier concentration of the semiconductor to greatly improve the photocurrent characteristic of the semiconductor. The pressure of the reducing atmosphere may be a normal pressure (atmospheric pressure) or may be under a reduced pressure condition.

Figure 2:
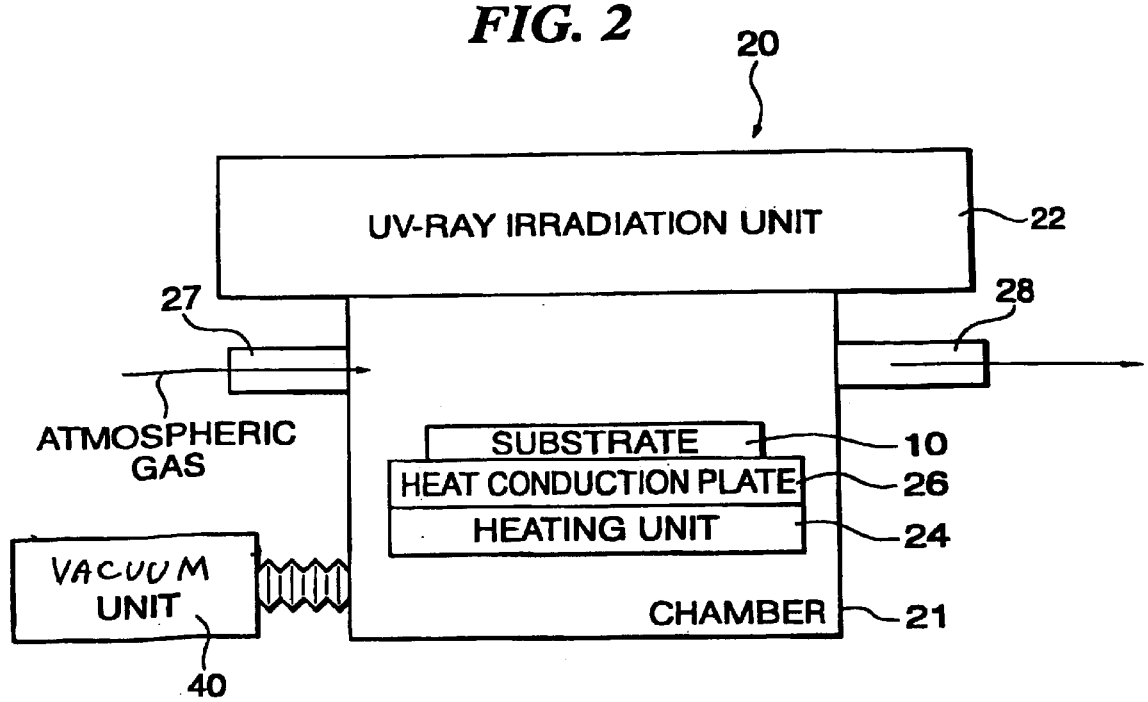
FIG. 2 is a schematic view illustrating an annealing device used for the method according to this invention.

FIG. 2 shows an experimental device for conducting an annealing treatment in a nitrogen gas containing a hydrogen gas and FIG. 1 shows an optoelectronic conversion efficiency of a photocatalyst thin film obtained by conducting an annealing treatment to an amorphous titanium dioxide thin film while varying the annealing temperature to 10 minutes, 15 minutes and 30 minutes together with that before the anneal treatment (reference). The temperature for the annealing treatment was 125° C. (refer to Example 1 for atmosphere/photo-irradiation condition). As can be seen from FIG. 1, the current density is increased remarkably after the annealing, which supports that the amorphous titanium dioxide is crystallized by the annealing treatment. Further, it can be seen that the photocurrent density increases more by making the annealing time longer. Further, an X-ray diffraction peak was observed at d=3.52 Å with 2θ of 25.260 by X-ray diffractiometry. This exhibits an anatase type (1, 0, 1) face.

The crystalline semiconductor thin film obtained by the method according to this invention is, for example, anatase type crystal or mixed crystal of anatase type and rutile type in the case of titanium dioxide.

Further, FIG. 2 is a schematic conceptual view showing an example of an annealing device for conducting crystallization in a reducing gas atmosphere in which an annealing device 20 includes a chamber 21 for accommodating a base material provided with an amorphous semiconductor thin film (hereinafter sometimes referred to as a substrate), an UV-ray irradiation unit 22, a heating unit 24, a heat conduction plate 26 for conducting heat from the heating unit, a not-illustrated atmospheric gas introduction/discharge unit, an atmospheric gas introduction channel 27, an atmospheric gas discharge channel 28 and a vacuum unit 40. Reference numeral 10 denotes a substrate in which an amorphous semiconductor thin film is provided to a basic material. Further although not illustrated, a temperature detection unit is disposed between the substrate 10 and the heat conduction plate 26 and the substrate temperature (temperature of the amorphous semiconductor thin film) is controlled by a not-illustrated temperature control device. Further, the oxygen partial pressure in the chamber is lowered when the device is used. Since the oxygen pressure can be lowered also by flowing a reducing gas for a predetermined period of time without using the vacuum unit, a structure not providing the evaluation unit can also be adopted in this case. As the UV-ray irradiation unit, an excimer lamp is preferred, an electrically heating heater is used as the heating unit, a heat conductive ceramic plate is used, for example, as the heat conduction plate and thermocouple are used, for example, as the temperature detection unit. A turbo molecular pump is used for example, as the vacuum unit.

When the evaluation unit is used, the substrate 10 is placed on the heat conduction plate 26 and then the inside of the chamber is once evacuated by the evaluation unit 40 to lower the oxygen partial pressure in the inside. The heat conduction plate 26 is heated by the heating unit 24 to elevate the temperature of the substrate. When the substrate temperature reaches the annealing temperature, a reducing gas such as a hydrogen-nitrogen gas mixture is introduced into the annealing device and, after replacing the inside sufficiently by flowing the reducing gas, UV-ray irradiation is started.

Further, in the annealing device for preparing the semiconductor thin film according to this invention, the vacuum unit for exhausting the gas in the device such as a turbo molecular pump may be disposed instead of the atmospheric gas introduction/discharge unit in the annealing device of FIG. 2.

Since the method of preparing the semiconductor thin film according to this invention can be conducted by a low temperature annealing, there is no requirement of using the heating unit or temperature control unit of any special specification and inexpensive units may be used advantageously.

Further, this invention also relates to a lamination formed with a crystalline semiconductor thin film prepared to the base material by the method as described above. This invention further relates to also a lamination having a crystalline semiconductor thin film on a plastic base material.

In the laminations, a transparent conductive thin film can be disposed between the base material or the plastic material and the crystalline semiconductor thin film. In this case, the laminations can be used as the color filter substrate.

Then, a description will be made to a lamination in which a transparent conductive thin film and a photovoltaic activity generating crystalline semiconductor thin film are disposed successively on a transparent plastic base material (photo-electrodeposited substrate) and a method of manufacturing a color filter by using the photo-electrodeposited substrate.

Figure 3:
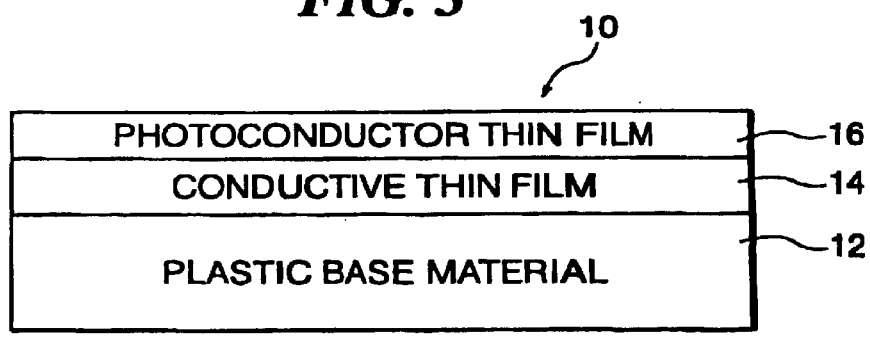
FIG. 3 is a conceptual view illustrating the constitution of a substrate for manufacturing a color filter according to this invention.

FIG. 3 shows an example of a photo-electrodeposited substrate according to this invention. In FIG. 3 are shown a photo-electrodeposited substrate 10, a plastic base material 12, a transparent conductive thin film 14, and a photosemiconductor thin film 16 respectively. The photo-electrodeposited substrate is prepared by providing a transparent conductive thin film to a plastic base material, forming an amorphous semiconductor thin film further thereon and crystallizing amorphous semiconductor thin film by application of UV-rays while heating the amorphous semiconductor thin film as described above.

Since the effect of light diffraction can be decreased in the case where the plastic base material is 0.2 mm or less, there is no requirement of using a device having an exposure device with a focusing optical system or mirror reflection optical system and film can be deposited by the device to be described below.

Figure 4:
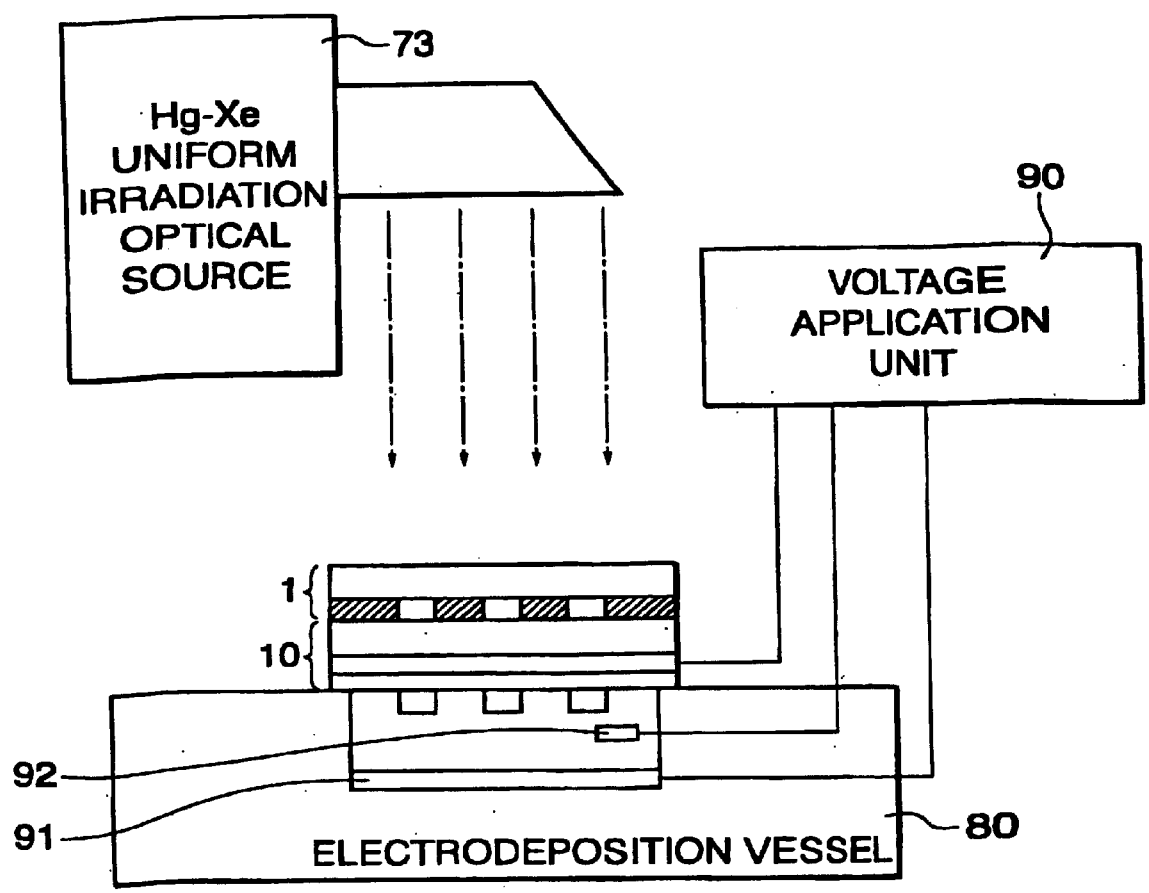
FIG. 4 is a conceptual view illustrating an example of an electrodeposition device used for a photo-electrodeposition method.

Subsequently, when the electrodepositing substrate is immersed in an electrodeposition solution and photo-electrodeposition is conducted. FIG. 4 shows a conceptual view for an example of an electrodeposition device used in this invention. The electrodeposition device shown in FIG. 4 is a device suitable to conducting electrodeposition to a substrate using a base material of such a thin thickness as not causing light diffraction described above (plastic base material or the like) and includes a photomask 71, an electrodeposition vessel 80 for containing an electrodeposition solution, a voltage application unit 90 such as a potentiostat, a counter electrode 91 made of platinum black, a reference electrode 92 such as a saturated calomel electrode and an Hg—Xe uniform radiation light source 73. The photomask 71 is used in close contact with a plastic base material 12.

Figure 5:
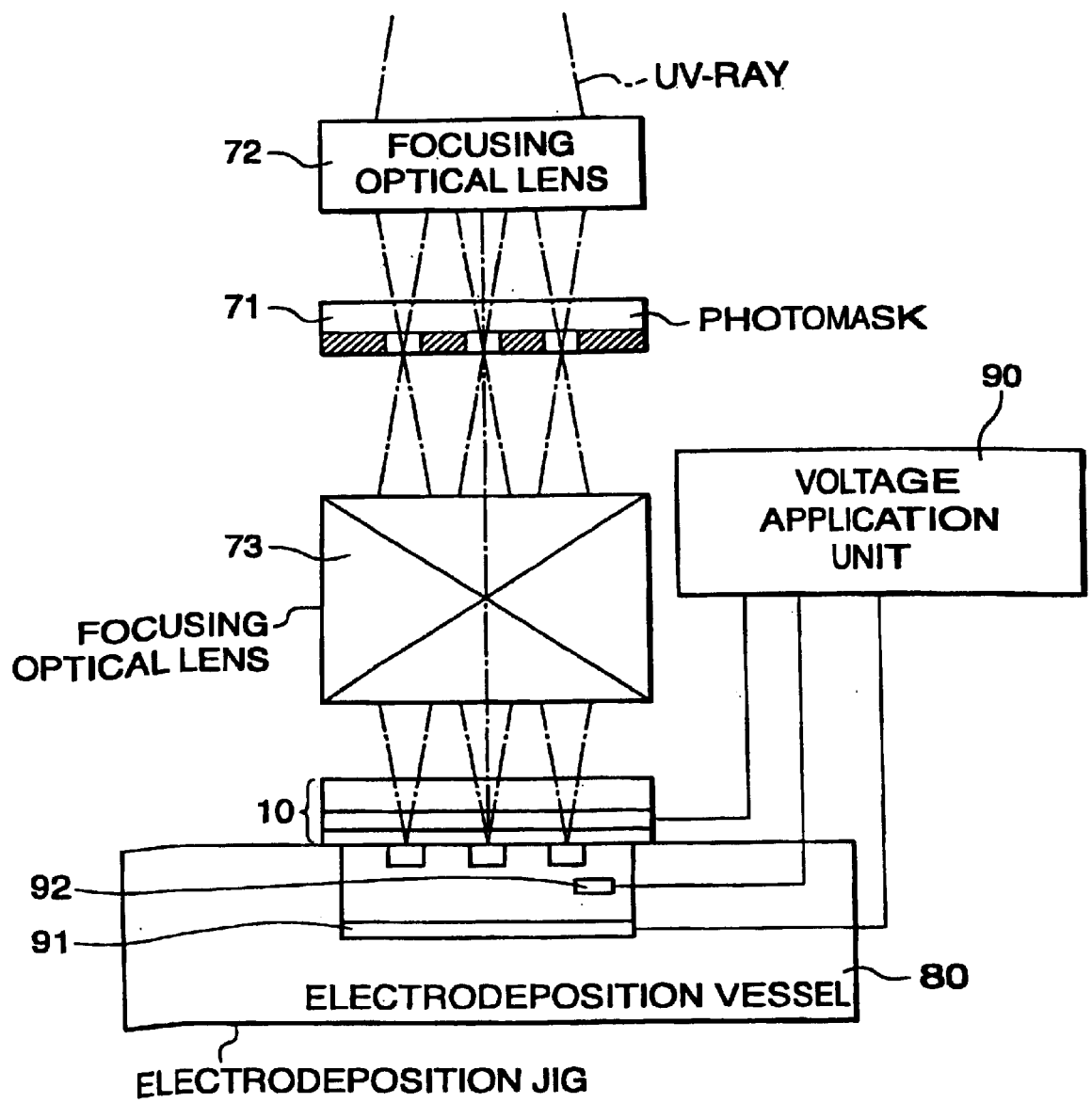
FIG. 5 is a conceptual view illustrating another example of an electrodeposition device used for a photo-electrodeposition method.

FIG. 5 shows another example of the electrodeposition device. A color filter manufacturing device shown in FIG. 5 has a projection type exposure device and includes an optical source for applying UV-rays (not-illustrated), a focusing optical system having a first focusing optical lens 72 and a second focusing optical 73 a photomask 71 interposed between the first focusing optical lens and the second focusing optical lens, an electrodeposition vessel 80 containing an electrodeposition solution, a voltage application unit 90 such as a potentiostat, a counter electrode 91 and a reference electrode 92 such as a saturation calomel electrode. In the color filter manufacturing device described above, a mirror reflection optical system can also be used instead of the focusing optical system.

Upon electrodeposition, as shown in FIG. 5, a substrate is disposed in the electrodeposition device such that the semiconductor thin film of the substrate is in contact with the electrodeposition solution in the electrodeposition vessel and the light from the exposure device is controlled so as to focus on the surface of the semiconductor thin film.

It is preferred to adjust the distance between the focusing optical lens of the focusing optical system and the surface of the transparent substrate to 1 mm to 50 cm in view of handling, and the focal depth of the focusing optical system is preferably within a range from ±10 to ±100 $\mu$m in view of the accuracy and handling.

Further, for the electrodeposition solution, all the techniques described in columns 0017 to 0041 in Japanese Published Unexamined Patent Application No. Hei 11-174790 can be utilized. Further, the heat resistance and the solvent resistance of the color filter film can be improved by using the electrodepositing polymeric material introduced with crosslinking groups and applying a heat treatment after forming a colored film. As the electrodeposition solution using the electrodepositing polymeric material introduced with crosslinking groups, the electrodeposition solution described in columns 0037 to 0050 in Japanese Patent Application No. 2000-227721 can be used.

When UV-rays are irradiated selectively to the photoconductor thin film by using a photomask as shown in FIG. 4 or 5, photovoltaic activity is generated in the selected area and an electrodepositing material in the electrodeposition solution is deposited on the photosemiconductor thin film. In this case, it is not necessary to apply a bias voltage from a voltage application device if the voltaic power to be generated is large enough to cause electrodeposition but a bias voltage at about several volts is applied from the voltage application device if it is insufficient.

Explanation has been made for the electrodeposited substrate in the case of an example using a plastic base material but it will be apparent that a base material such as a glass base material can also be used instead of the plastic base material.

Further, the method of manufacturing the color filter described above is a method of depositing a film by a photo-electrodeposition method but the film can be deposited also by the photocatalytic method. The photocatalytic method utilizes the photocatalytic effect of the photosemiconductor. When a film deposited substrate having a transparent substrate, a conductive film (possibly also transparent) and a transparent semiconductor thin film is used and light is applied to a selected area of the semiconductor thin film, an internal circuit is formed between each of semiconductor thin film/conductive film/electrolyte to cause electrolysis in the electrolyte in contact with the semiconductor thin film and hydrogen ion concentration in the electrolyte near the semiconductor thin film can be changed. By the change of the hydrogen ion concentration, precipitation of the material from the electrolyte, that is, film deposition is possible in the same manner as in the photo-electrodeposition method. As the electrolyte, an aqueous solution of an identical constitution with the electrodeposition solution used in the photo-electrodeposition method can be used. Further, in the case of the photocatalytic method, it is necessary that the conductive film is in conduction with the electrolyte and the semiconductor thin film and the conduction film are in contact with each other but the counter electrode is not necessary. The photocatalytic method is explained specifically in Japanese Published Unexamined Patent Application Nos. Hei 11-322507 and Hei 11-322508.

EXAMPLE

This invention is to be explained by way of examples but the invention is not restricted to such examples. "%" in the examples represents "mass %" except for the case of gases.

Example 1

To a non-alkali glass substrate of 0.7 mm thickness (Corning 1737 glass), amorphous titanium dioxide was deposited at a film thickness of 200 nm at a substrate temperature of 180° C. using an RF sputtering method. Then, using an experimental device as shown in FIG. 2 having an inner capacity of about 1 liter), after previously removing oxygen by a vacuum treatment (to $10^{-2}$ Pa), the glass substrate formed with titanium dioxide was heated to 150° C. in a high purity nitrogen gas atmosphere containing 3% hydrogen gas (flow rate: 1 l/min, atmospheric pressure), and UV-rays (wavelength: 172 nm, light intensity: 10 mW/cm$^2$) were applied for 10 minutes by an excimer lamp (manufactured by Ushio, Inc.) while keeping the temperature.

When the X-ray diffraction intensity of the resultant annealed film was examined. A diffraction peak was observed at 2θ of 25.260. Further, as a result of examination for the angle of contact of the film, it was 1.5° and it was observed that the surface was strongly hydrophilic.

The result described above supports that amorphous titanium oxide was converted into a photosemiconductor by the annealing treatment.

Example 2

On a plastic sheet of 0.1 mm thickness (PES film, manufactured by SUMITOMO BAKELITE), an annealed film was formed on the plastic sheet in the same manner as in Example 1 except for changing the temperature for the annealing treatment to 125° C.

When the X-ray diffraction intensity of the resultant annealed film was examined. A diffraction peak was observed at 2θ of 25.260. Further, as a result of examination for the angle of contact of the film, it was 2.5° and it was observed that the surface was strongly hydrophilic.

The result described above supports that amorphous titanium oxide was converted into crystalline titanium oxide (photoconductor) by the annealing treatment.

Example 3

A crystalline titanium oxide thin film was formed on a plastic sheet in the same manner as in Example 2 except for changing the temperature for the annealing treatment to 50° C. and the UV-ray irradiation time to five hours.

The resultant thin film showed the same nature as that in Example 2.

Example 4

A crystalline titanium oxide thin film was formed on a plastic sheet in the same manners in Example 2 except for changing the temperature for the annealing treatment to 180° C. and the UV-ray irradiation time to five minutes.

The resultant thin film showed the same nature as that in Example 2.

Example 5

This example describes preparation of a substrate having a transparent conductive thin film and a photosemiconductor thin film to a transparent plastic base material as the substrate and preparation of a color filter using the substrate.
[Preparation of Substrate]

A polycarbonate film with ITO of 125 μm thickness was provided and, after washing with water, a titanium dioxide (TiO$_2$) film of 200 nm thickness in an amorphous state was formed on the ITO film by an RF sputtering method while keeping the film temperature at 180° C. Then, while flowing a high purity nitrogen gas containing 3% hydrogen at a flow rate of 1 l/min by using the annealing device shown in FIG. 2, light from an excimer lamp (lamp: manufactured by Ushio, Inc., wavelength: 172 nm, light intensity: 10 mW/cm$^2$) was applied for 30 minutes while controlling the substrate temperature at 125° C.

UV-light (1 KW Hg—Xe lamp, 365 nm, 50 mW/cm$^2$) was applied to the titanium dioxide thin film before and after the annealing treatment and the current/voltage characteristic was examined. The result is shown in FIG. 1.

As apparent from FIG. 1, the current density increases remarkably after annealing, which supports that amorphous titanium dioxide was crystallized by the annealing treatment. Further, an X-ray diffraction peak was observed at 2θ of 25.260 by X-ray diffractometry.
[Formation of Color Filter on the Substrate]

The substrate prepared as described above was used as a substrate for manufacturing a color filter. A close contact arrangement type device of a structure shown in FIG. 4 was used as the photo-electrodeposition device. The ITO film of the substrate was utilized as an electrodepositing operation electrode.
<Formation of Red Colored Film>

A styrene-acrylic acid copolymer (molecular weight: 13,000, hydro-group/(hydrophilic group+hydrophobic group) molar ratio: 65%, acid value: 150) and a superfine particle red pigment were dispersed at resin/pigment=1:1 by mass solid ratio. An electrodeposition solution R at a solid concentration of 10 mass % (pH=7.8, conductivity=8 mS/cm) was prepared.

As shown in FIG. 4, the substrate was located such that the photosemiconductor thin film was in contact with the electrodeposition solution R and a photomask for a red filter was brought into intimate contact with the substrate on the surface not provided with the photosemiconductor thin film (hereinafter referred to as a "rear face"). Then, voltage was applied by a potentiostat to the ITO conduction film using the ITO film as an operation electrode such that the bias potential difference of the operation electrode to the saturation calomel electrodes was plus 1.7 V.

Then, when light was applied by a mercury xenon lamp (manufactured by Yamashita Denso, wavelength: 365 nm, light intensity: 50 mW/cm$^2$) through the photomask from the rear face of the substrate for 10 seconds, a red pattern of a uniform film thickness of 10 μm was formed only on the irradiated area at the surface of the photosemiconductor thin film (selected area).
<Formation of Green Colored Films>

An electrodeposition solution G was prepared in the same manner as the red colored film except for changing the pigment to a superfine particle phthalocyanine green pigment and charging the resin/pigment (mass ratio) to 1:0.7, and washed with purified water. A green pattern of uniform film thickness of 1.0 μm was formed.
<Formation of Blue Colored Film>

An electrodeposition solution B was prepared in the same manner as the red colored film except for changing the pigment to a superfine particle phthalocyanine blue pigment and washed with purified water. A blue pattern of uniform film thickness of 1.0 μm was formed.
<Formation of Black Matrix>

When electrodeposition was conducted in the same manner as in the formation of the red film except for using an electrodeposition solution K (pH=7.8, conductivity=8 mS/cm) at a solid concentration of 7 mass % formed by dispersing carbon black powder (average particle size: 80 nm) instead of the pigment upon forming the red colored film at polymeric material/carbon black=1:1 volumic ratio and conducting entire exposure for 10 sec by the same exposure device without using a photomask, a black matrix was formed in an area not formed with the colored film.

A flexible color filter at a high resolution having a fine pixel pattern and excellent surface smoothness was obtained.

Example 6

Each of colored films of red, green and blue and a black matrix each of 1.0 μm uniform film thickness were formed on a substrate in the same manner as in Example 4 except for changing the substrate to a polyether sulfone of 0.1 mm thickness provided with ITO of 100 nm thickness and using an electrodeposition solution R, an electrodeposition solution G, an electrodeposition solution B and an electrodeposition solution K formed by replacing the polymeric material for each of the electrodeposition solution (for red, green, blue and black matrix) in Example 5 with a styrene/acrylic acid/2-(O-[1'-methylpropylideneamino]carboxyaminoethyl) methacrylate copolymer [molecular weight: 13,000, hydrogroup/(hydrophilic group+hydrophobic group) molar ratio: 65%, acid value: 150), 2-(O-[1'-methylpropylideneamino] carboxyamino)ethyl methacrylate content: 3.3 mol %] as the crosslinking group introduced polymeric material.
<Baking>

Heat crosslinking was applied at 170° C. for 30 minutes to the substrate formed with the colored film and the black matrix. A flexible color filter of a fine pixel pattern having a high resolution, excellent in the surface smoothness and excellent in the solvent resistance was obtained.

Example 7

This example shows an example of manufacturing a color filter by using an electrodeposition device having a projection type exposure device as shown in FIG. 5 (manufactured by Ushio, Inc.) as the electrodeposition device.

The same substrate as in Example 6 was used, and the electrodeposition solution R, the electrodeposition solution G, the electrodeposition solution B and the electrodeposition solution K of the identical composition as in Example 6 were used as the electrodeposition solution. In the projection type exposure device of the electrodeposition device (Ushio, Inc.), the focal distance between the focusing optical lens 73 and the focusing surface (exposed surface of the photosemiconductor thin film) was set to 10 cm and the focal lens was set to ±50 μm.

As shown in FIG. 5, the substrate was located such that the photosemiconductor thin film was in contact with the electrodeposition solution and the exposure device was adjusted such that the light from the focusing optical lens was focused on the focusing surface.

R, G and B films and the black matrix each having uniform 1.0 μm in film thickness were prepared in the same manner as in Example 6 except for changing the light intensity of the irradiated UV-rays (wavelength: 365 nm) to 100 mW/cm$^2$ and the irradiation time to five seconds, while successively changing the electrodeposition solutions in the order of the electrodeposition solution R, the electrodeposition solution G, the electrodeposition solution B and the electrodeposition solution K. However, in the case of manufacturing the black matrix, exposure was applied entirely from the rear face. Finally baking was conducted in the same manner to obtain a color filter.

An excellent color filter was obtained in the same manner as in Example 6.

Example 8

This example shows a manufacturing example of a color filter for forming a black matrix at the first.

The same substrate as used in Example 7 was used and the electrodeposition solution R, the electrodeposition solution G, the electrodeposition solution B and the electrodeposition solution K of the identical composition with that in Example 7 were used as the electrodeposition solution. Further, the electrodeposition device identical with that in Example 7 was used.

At first, a black matrix was prepared by conducting electrodeposition using the electrodeposition solution K under the same conditions as the conditions for forming the black matrix in Example 7 (except for using the focusing optical system). Then, electrodeposition was conducted in the same manner while changing the electrodeposition solution to the electrodeposition solution R, the electrodeposition solution G and the electrodeposition solution B successively to form R, G and B films each of uniform 1.0 μm thickness. Then, baking was applied in the same manner to obtain a color filter.

An excellent color filter was obtained in the same manner as in Example 6.

In the method of forming the crystalline semiconductor thin film according to this invention, compared with an existent method of obtaining a crystalline semiconductor thin film by annealing an amorphous semiconductor thin film by laser beam irradiation at a temperature near 1000° C., the heating temperature can be lowered significantly, scanning of the laser beam spot is not necessary and the UV-rays may merely be applied entirely by an UV-ray irradiation device. Accordingly, it is possible to manufacture a semiconductor thin film in a shorter period of time and with no requirement of a large-scaled device compared with the existent method and, as a result, the production cost is reduced outstandingly.

Accordingly, while special steps and devices were necessary for forming the semiconductor thin film on the plastic base material so far, this invention enables to manufacture a crystalline semiconductor thin film on a plastic base material by using simple and convenient method and device.

Further, for applying anticlouding treatment, antifouling treatment, hydrophilic treatment or the like to the surface of mirror, glass or the like, it was necessary to form an amorphous semiconductor thin film on the surface of the mirror, glass or the like and then sinter the same at 400° C. or higher, and this was a complicated method. On the contrary, since a substrate providing a photosemiconductor thin film to a plastic base material can be obtained easily according to the manufacturing method of this invention, a desired surface property can be obtained quite simply by appending such a substrate to the surface requiring the anticlouding, antifouling or hydrophilic treatment.

Further, it is possible to manufacture a TFT driving circuit on a plastic base material or to form a semiconductor thin film for generating photovoltaic power further thereon as an electrodeposited substrate, thereby forming a color filter film by photo-electrodeposition. Particularly, in the case of the color filter, transparency is required for the base material but transparent plastic base materials known at present have the heat resistance only at about 200° C. Therefore, it is highly evaluated that a semiconductor thin film of a sufficiently high photoelectronic conversion efficiency (photovoltaic activity) can be formed by the heat treatment at about 200° C. Accordingly, it can be expected for the application use as a flexible color filter for use in liquid crystal display panels, for which weight reduction will be demanded more and more.

The entire disclosure of Japanese Patent Application No. 2001-196561 filed on Jun. 28, 2001 including specification, claims, drawings and abstract is incorporated herein by reference in its entirety.

What is claimed is:

1. A method of forming a crystalline semiconductor thin film on a base material, comprising: applying UV-rays to an amorphous semiconductor thin film provided on a base material while keeping a temperature of the thin film at not less than 25° C. and not more than 300° C. in a vacuum or a reducing gas atmosphere.

2. The method of forming a crystalline semiconductor thin film on a base material according to claim 1, wherein the reducing gas atmosphere contains a hydrogen gas.

3. The method of forming a crystalline semiconductor thin film on a base material according to claim 1, wherein the UV-rays are light from an excimer lamp.

4. The method of forming a crystalline semiconductor thin film on a base material according to claim 1, wherein the kept temperature is within a temperature range from 50° C. to 250° C.

5. The method of forming a crystalline semiconductor thin film on a base material according to claim 1, wherein the base material is a plastic base material and the kept temperature is within a temperature range, from 50° C. to a heat resistant temperature of the plastic base material.

6. The method of forming a crystalline semiconductor thin film on a base material according to claim 5, wherein the heat resistant temperature of the plastic base material is from 100 to 230° C.

7. The method of forming a crystalline semiconductor thin film on a base material according to claim 1, wherein the amorphous semiconductor thin film is an oxide semiconductor thin film.

8. The method of forming a crystalline semiconductor thin film on a base material according to claim 1, wherein the amorphous semiconductor thin film is a titanium oxide thin film formed by a sputtering method.

9. The method of forming a crystalline semiconductor thin film on a base material according to claim 1, wherein the crystalline semiconductor thin film is an anatase type titanium oxide thin film or a thin film comprising mixed crystals of anatase type titanium dioxide and rutile type titanium dioxide.

10. The method of forming a crystalline semiconductor thin film on a base material according to claim 1, wherein a transparent conductive thin film is disposed between the base material and the amorphous semiconductor thin film.

11. A method of applying UV-rays to an amorphous metal oxide thin film disposed on a base material under a reduced pressure or in a reducing gas atmosphere, and with a temperature of the thin film maintained at not more than 300° C. thereby changing the amorphous metal oxide into a crystalline metal oxide thin film.

12. The method according to claim 11, wherein UV-rays are irradiated uniformly on the thin film.

13. The method according to claim 11, wherein, when the temperature is kept at a first temperature value, changing the amorphous metal oxide into a crystalline metal oxide thin film needs a first amount of time of irradiation of the UV-rays, the method further comprising:

keeping the temperature at a second temperature value to change the amorphous metal oxide into a crystalline metal oxide thin film within a second amount of time of irradiation of the UV-rays, wherein the second temperature value is higher than the first temperature value, and the second amount of time is less than the first amount of time.

* * * * *